United States Patent
Kizilyalli et al.

(10) Patent No.: US 6,548,854 B1
(45) Date of Patent: Apr. 15, 2003

(54) COMPOUND, HIGH-K, GATE AND CAPACITOR INSULATOR LAYER

(75) Inventors: Isik C. Kizilyalli, Orlando, FL (US); Yi Ma, Orlando, FL (US); Pradip Kumar Roy, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 08/995,435

(22) Filed: Dec. 22, 1997

(65) Prior Publication Data (65)

(51) Int. Cl.[7] .............................................. H01L 29/76
(52) U.S. Cl. ....................... 257/310; 257/295; 257/310; 257/311; 257/312; 257/313; 257/314
(58) Field of Search ................................ 257/310, 311, 257/295, 312, 313, 314

(56) References Cited

U.S. PATENT DOCUMENTS

| | | | |
|---|---|---|---|
| 4,851,370 A | | 7/1989 | Doklan et al. ............... 437/225 |
| 4,891,684 A | * | 1/1990 | Nishioka et al. .............. 357/51 |
| 5,057,463 A | * | 1/1990 | Bryant et al. ................ 437/238 |
| 4,903,110 A | * | 2/1990 | Aono .......................... 357/51 |
| 5,132,244 A | | 7/1992 | Roy ............................ 437/13 |
| 5,153,701 A | * | 10/1992 | Roy ............................ 357/54 |
| 5,444,006 A | | 8/1995 | Han ............................ 437/60 |
| 5,478,772 A | * | 12/1995 | Fazan .......................... 437/60 |
| 5,498,890 A | * | 3/1996 | Kim et al. ................... 257/310 |
| 5,723,361 A | * | 3/1998 | Azuma et al. ............... 437/180 |
| 5,814,562 A | | 9/1998 | Green et al. | |
| 5,814,852 A | * | 9/1998 | Sandhu et al. .............. 257/310 |

FOREIGN PATENT DOCUMENTS

| | | | |
|---|---|---|---|
| DE | 43 20 089 A1 | 6/1992 | ........... H01L/21/28 |
| EP | 0 568064 A2 | 11/1993 | ......... H01L/21/314 |
| JP | 62(1987)-35562 | 2/1987 | |
| JP | 405145016 | * 6/1993 | ................. 257/310 |
| JP | 405243486 | * 6/1993 | ................. 257/310 |
| JP | 405275711 | * 10/1993 | ................. 257/310 |
| JP | 405283612 | * 10/1993 | ................. 257/310 |

OTHER PUBLICATIONS

"Thin Gate Oxides: Growth And Reliability", Stanley Wolf, *Silicon Processing For The VLSI Era, vol. 3: The Submicron MOSFET*, pp. 496–499.

Patent Abstracts of Japan, Publication No. 02260572 dated Oct. 23, 1990. Abstract Only.

European Search Report, Dated Jun. 6, 1998.

"Reduction Of Current Leakage In Chemical–Vapor Deposited $Ta_2O_5$ Thin–Films By Oxygen–Radical Annealing," Yuichi Matsui et al., *IEEE Electron Device Letters*, vol. 17, No. 9, Sep. 1996.

"Deposition Of High Delectric Constant Materials By Special Sources Assisted Metalorganic Chemical Vapor Deposition," R. Singh et al., *Applied Physics Letters*, vol. 67, No. 26, pp. 3939–3941.

(List continued on next page.)

*Primary Examiner*—Eddie Lee
*Assistant Examiner*—Edgardo Ortiz
(74) *Attorney, Agent, or Firm*—Anthony Grillo

(57) ABSTRACT

A gate or capacitor insulator structure using a first grown oxide layer, a high-k dielectric material on the grown oxide layer, and a deposited oxide layer on the high-k dielectric material. The deposited oxide layer is preferably a densified deposited oxide layer. A conducting layer, such as a gate or capacitor plate, may overlay the densified oxide layer.

20 Claims, 1 Drawing Sheet

OTHER PUBLICATIONS

"Synthesis Of High–Quality Ultra–Thin Gate Oxides For ULSI Applications," P. K. Roy et al., *AT&T Technical Journal,* Nov./Dec. 1988, pp. 155–174.

"Characterization Of Stacked Gate Oxides By Electron Holography", W.–D. Rau et al.,*Applied Physics Letters,* vol. 68, No. 24, Jun. 10, 1996, pp. 3410–3412.

"Preparation of Pbti0$_3$ Thin Films By Plasma Enhanced Metalorganic Chemical Vapor Deposition," E. Fujii et al., *Applied Physics Letter,* vol. 65, No. 3, Jul. 18, 1994, pp. 365–367.

"Films Prepared By Liquid Source Chemical Vapor Deposition On Ru Electrodes," T. Kawahara et al., *Japanese Journal Of Applied Physics,* Part 1, vol. 35, No. 35, 9B, 1996, pp. 4880–4885.

"Electrical Properties Of Low Temperature (450 Degrees C)," W. Zhang et al., *Japanese Journal Of Applied Physics,* Part 1, vol. 35, No. 35 9B, 1996, pp. 5084–5088.

* cited by examiner

COMPOUND, HIGH-K, GATE AND CAPACITOR INSULATOR LAYER

CROSS-REFERENCE TO RELATED APPLICATION

This application claims priority of Provisional Application Serial No. 60/033839 which was filed on Dec. 23, 1996.

This application is related to a co-pending patent application titled "Method of Making a Compound, High-K, Gate and Capacitor Insulator Layer", by Kizilyalli et al., Ser. No. 08/995,589, filed simultaneously with, and assigned to the same assignee, as this application.

BACKGROUND OF THE INVENTION

1. Field of the Invention

This invention relates to integrated circuits in general and, more particularly, to gate/capacitor dielectrics having a high dielectric constant (high K).

2. Description of the Prior Art

As feature sizes on integrated circuits gets smaller, the amount of capacitance for a given circuit element decreases, such as with a memory storage capacitor, and operating voltages are decreased.

For a transistor to operate reliably at lower voltages, the threshold voltage of the transistor is correspondingly lowered. One approach to lower the threshold voltage is to thin the insulating layer (usually a single layer of silicon dioxide) separating the transistor gate from the transistor channel. But at very thin insulating thicknesses (e.g., an oxide layer thickness of less than 3.5 nm), the oxide layer suffers from pinholes and leakage may be too large. Further, if the oxide layer is less than 2.5 nm, tunneling of electrons from the transistor channel may occur, degrading transistor performance. Alternatively, the gate may be effectively "moved" closer to the channel by incorporating a high dielectric constant (k) material as the gate insulator between the gate and the transistor channel. However, this approach with high-k materials (such as ferroelectric dielectrics) has not been entirely satisfactory because of defects within the dielectric and also at the silicon/dielectric interface, due for example by lattice mismatch, causing excessive gate to substrate leakage.

The reduced feature size and lower operating voltage is of special concern with dynamic memories where capacitors are used to store information. As more memory cells are added to a given memory array and feature sizes are decreased so that the extra cells can be added within a reasonable chip size, the size of the storage capacitors are correspondingly decreased. With lower capacitance of the storage capacitors and reduced voltage on the capacitors, the memory may become more error prone. To compensate for the reduction in capacitor size and still maintain capacitance, two approaches can be used singly or in combination: dielectric thinning and increasing the dielectric constant. But the same problems with both approaches discussed above apply here as well.

From a practical point of view, the use of high-k materials may be the most desirable choice to solve the above problems at feature sizes of 0.35 $\mu$m and below if the leakage/defects problems can be satisfactorily solved.

Therefore, there exists a need for incorporating high dielectric materials into integrated circuit designs with reduced defect and leakage problems of the heretofore approaches of device fabrication incorporating high dielectric constant materials.

SUMMARY OF THE INVENTION

This and other aspects of the invention may be obtained generally with an integrated circuit having an oxidizable layer having a surface, such as a silicon substrate or a polysilicon layer, having: a grown oxide layer on the oxidizable surface, a high-k dielectric layer on the grown oxide layer, and a deposited oxide layer on the high-k dielectric layer. Preferably, the grown oxide layer is grown from the substrate or polysilicon layer.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
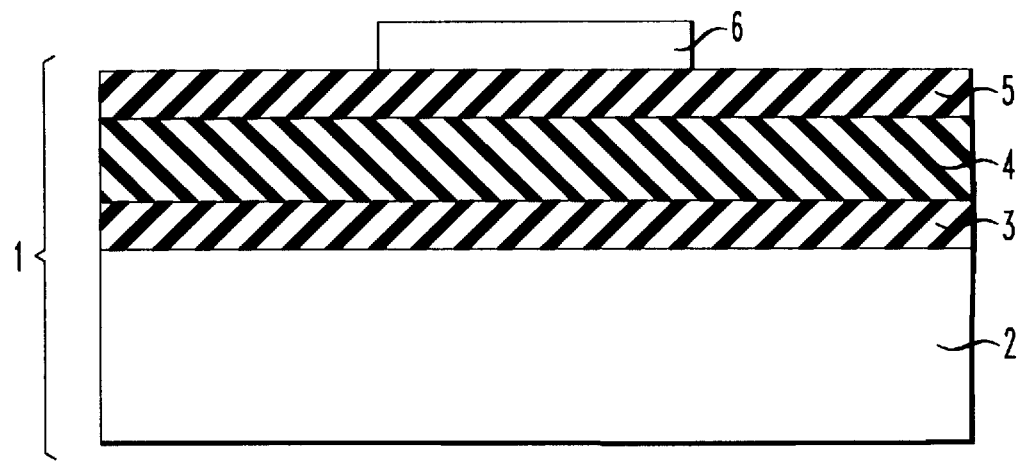
FIG. 1 is a cross section of a partially formed exemplary transistor having a gate oxide fabricated according to one embodiment of the invention.

Generally, the invention may understood by referring to FIG. 1. As discussed below in more detail and in accordance with one embodiment of the invention, an integrated circuit including a wafer 1 having an oxidizable layer 2, here a silicon substrate but may be any oxidizable layer such as a polysilicon layer, has thereon a grown oxide layer 3, the layer 3 being preferably an oxide of the substrate 2. On the layer 3 is a layer of a high dielectric constant material 4 (referred to herein as a high-k dielectric material), to be described below. Over layer 4 is a deposited oxide layer 5. Preferably, the deposited oxide layer 5 is densified.

In more detail and describing how the wafer 1 is made, the wafer 1 includes an exemplary silicon substrate 2 which has grown thereon an oxide layer 3, here a silicon dioxide layer with the silicon becoming substantially the substrate 2. The layer 3 is preferably grown in a conventional dry oxidizing atmosphere at 0.25 to 10 torr and 650° to 900° C. to form 1 to 2 nm thick oxide, the thicknesses not being critical but of sufficient thickness to avoid substantial pinhole formation and a good substrate/oxide interface. While the oxide is preferably grown in a dry atmosphere, it may be grown in a wet (steam) atmosphere.

The layer 3 is believed to help reduce strain between the later deposited high-k dielectric layer 4 and the underlying silicon substrate 2 and provides a good interface with the silicon to reduce undesired surface states in the silicon. Without the layer 3, it is believed that a lattice mismatch between the substrate 2 and the later deposited layer 4 creates defects at the interface between the layers, decreasing the overall quality of the dielectric.

Over the grown dielectric layer 3 is deposited a layer or layers 4 of a high-k dielectric material, such as a ferroelectric dielectric material, this material having a dielectric constant greater than that of silicon dioxide. This material may be of group of materials including $Ta_2O_5$, $TiO_2$, $SrO_3$, and perovskite materials of the form $MTiO_3$, where M may be Sr, Ba, La, Pb, $Ba_xSr_{1-x}$, and $Pb_xLa_{1-x}$. It is understood that combinations of these layers may be used or interposed insulating layers, such as silicon dioxide, may be added. Exemplary thickness of the layer 4 are from 2 to 20 nm and done in a plasma enhanced, ion-beam assisted, or ozone low pressure chemical vapor deposition (LPCVD) or metalorganic chemical vapor deposition (MOCVD) processes. Examples of these processes are as disclosed in "Preparation of (Ba, Sr)TiO3 Thin Films by Chemical Vapor Deposition using Liquid Sources," by T. Kawahara et al., Japanese Journal of Applied Physics, V33, no. 10, 1994, pp. 5897–5902, and "Preparation of PbTiO3 Thin Films by Plasma Enhanced Metalorganic Chemical Vapor Deposition," by E. Fujii et al., Applied Physics Letters, Vol. 65, no. 3, 1994, pp. 365–367, included herein by reference.

After the formation of layer 4, a layer 5 of silicon dioxide is deposited. This layer is preferably 1 to 3 nm thick and preferably formed in a LPCVD reactor (not shown), preferably the same as that used to deposit layer 4. Typical source gasses for the silicon include tetraethylorthosilicate gases (TEOS) or silane.

The layer 5 is preferably densified by exposing the wafer 1 to a conventional densification anneal process in an oxidizing ambient atmosphere. An example of such a process step is in an LPCVD reactor operating at a pressure of 250 millitorr to 10 torr with temperatures between 650° and 900° C. for approximately 5–20 minutes. The oxidizing atmosphere may include $N_2O$ to add nitrogen to the layer 5.

The densification step helps improves the overall quality of the layer 5, remove traps (defects) in the layers 3–5, and reduces the overall leakage through the layers 3–5.

An exemplary conductive layer 6, such as polysilicon, is shown on layer 5. This layer 6 may be a gate or one plate of a capacitor (the other plate being the substrate 2 or an upper layer not shown), the combination of layers 3–5 being referred to herein as a gate or capacitor insulating layer. It is understood that the densification step described above may be done after the formation of layer 6 with the attendant oxidation of the layer 6 if unprotected.

Figure 2:
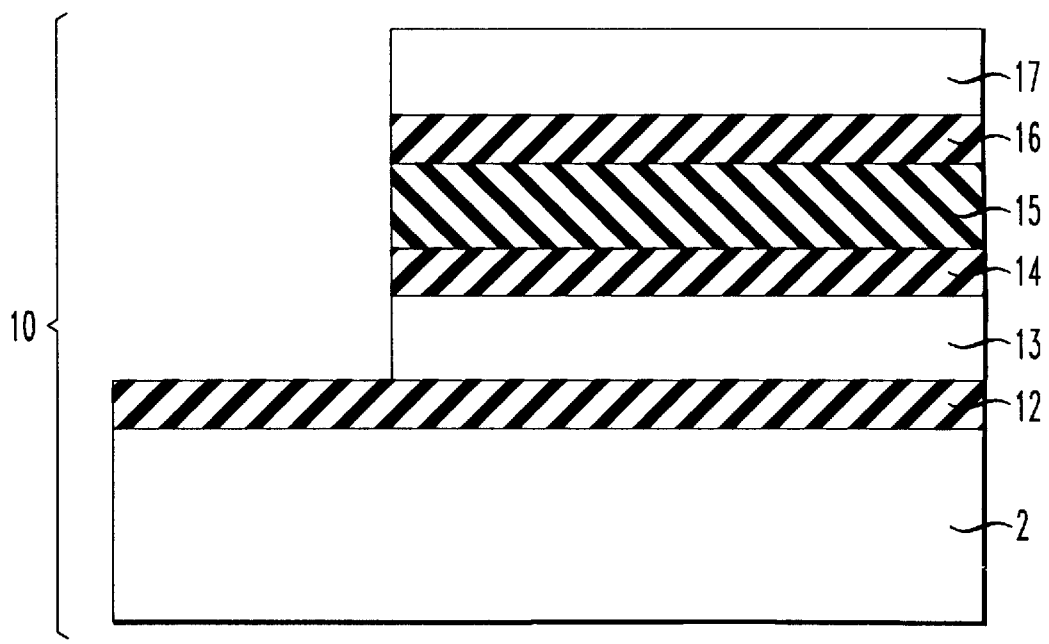
FIG. 2 is a cross section of a partially fabricated exemplary polysilicon-to-polysilicon capacitor with an dielectric layer fabricated according to another embodiment of the invention.

An alternative embodiment is shown in FIG. 2 for an exemplary capacitor structure. Here a wafer 10 has thereon an insulating layer 12 to separate an exemplary oxidizable and conductive layer 13, such as amorphous or polysilicon (the amorphous silicon being rendered conductive at a later step). Layers 14–16 correspond to layers 3–5 in FIG. 1 as described above. Layer 17, also preferably a conductive layer, along with layer 13 forms the plates of a capacitor while layers 14–16 form the capacitor insulating layer.

While silicon is described as the material type for the substrate and other layers, it is understood that other materials may be used, such as GaAs, InP, etc.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

The invention claimed is:

1. An integrated circuit having a silicon substrate with a surface, comprising:
    a densified grown oxide layer on the silicon substrate;
    a high-k dielectric layer on the densified grown oxide layer, the densified grown oxide layer reducing strain between the silicon substrate and the high-k dielectric layer; and
    a deposited oxide layer on the high-k dielectric layer.

2. The integrated circuit as recited in claim 1, wherein the deposited oxide layer is a densified deposited oxide layer.

3. The integrated circuit as recited in claim 2, wherein the high-k dielectric layer is selected from the group consisting of $Ta_2O_5$, $TiO_2$, and perovskite materials.

4. The integrated circuit as recited in claim 2, wherein the perovskite materials are of the form $MTiO_3$, where M is selected from the group of Sr, Ba, La, Ti, Pb, $Ba_xSr_{1-x}$ and $Pb_xLa_{1-x}$.

5. The integrated circuit as recited in claim 2, wherein the oxide layers are oxides of silicon.

6. The integrated circuit as recited in claim 5, wherein the silicon substrate is a polysilicon layer.

7. The integrated circuit as recited in claim 5, further comprising a conductive layer on the deposited oxide layer.

8. The integrated circuit as recited in claim 5, wherein the combination of layers forms a gate insulating layer.

9. The integrated circuit as recited in claim 5, wherein the combination of layers forms a capacitor insulating layer.

10. An integrated circuit having a silicon substrate with a surface, comprising:
    a grown densified silicon dioxide layer on the silicon substrate surface;
    a high-k dielectric layer on the grown densified oxide layer, the grown densified oxide layer reducing strain between the silicon substrate and the high-k dielectric layer; and
    a deposited densified silicon dioxide layer on the high-k dielectric layer.

11. The integrated circuit as recited in claim 10, wherein the high-k dielectric layer is selected from the group consisting of $Ta_2O_5$, $TiO_2$, and perovskite materials.

12. The integrated circuit as recited in claim 11, wherein the perovskite materials are of the form $MTiO_3$, where M is selected from the group of Sr, Ba, La, Ti, Pb, $Ba_xSr_{1-x}$ and $Pb_xLa_{1-x}$.

13. The integrated circuit as recited in claim 10, wherein the combination of layers forms a gate insulating layer.

14. The integrated circuit as recited in claim 10, wherein the combination of layers forms a capacitor insulating layer.

15. An integrated circuit having a silicon substrate with a surface, comprising:
    a densified grown oxide layer on the silicon substrate;
    no more than one high-k dielectric layer on the grown oxide layer, the grown oxide layer reducing strain between the silicon substrate and the high-k dielectric layer; and
    a deposited oxide layer on the high-k dielectric layer.

16. The integrated circuit as recited in claim 15, wherein the high-k dielectric layer is selected from the group consisting of $Ta_2O_4$, $TiO_2$, and perovskite materials.

17. The integrated circuit as recited in claim 15, wherein the perovskite materials are of the form $MTiO_3$, where M is selected from the group consisting of Sr, Ba, La, Ti, Pb, $Ba_xSr_{1-x}$ and $Pb_xLa_{1-x}$.

18. The integrated circuit as recited in claim 15, wherein the oxide layers are oxides of silicon.

19. The integrated circuit as recited in claim 15, wherein the silicon substrate is a polysilicon layer.

20. The integrated circuit as recited in claim 15, further comprising a conductive layer on the deposited oxide layer.

* * * * *